(12) United States Patent
Do

(10) Patent No.: US 7,394,712 B2
(45) Date of Patent: Jul. 1, 2008

(54) SEMICONDUCTOR MEMORY DEVICE PERFORMING SELF REFRESH OPERATION

(75) Inventor: Chang-Ho Do, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/648,398

(22) Filed: Dec. 29, 2006

(65) Prior Publication Data

US 2007/0253270 A1 Nov. 1, 2007

(30) Foreign Application Priority Data

Apr. 28, 2006 (KR) ...................... 10-2006-0038717

(51) Int. Cl.
*G11C 7/00* (2006.01)
(52) U.S. Cl. .................... 365/222; 365/189.05; 365/233
(58) Field of Classification Search ................. 365/222, 365/233, 236, 189.05
See application file for complete search history.

(56) References Cited

U.S. PATENT DOCUMENTS

| 6,621,352 | B2 * | 9/2003 | Matsumoto et al. ......... 331/1 A |
| 6,865,132 | B2 | 3/2005 | Schaefer et al. |
| 6,961,278 | B2 | 11/2005 | Jeong |
| 6,990,032 | B2 | 1/2006 | Jang |
| 7,061,287 | B2 * | 6/2006 | Jeon ........................... 327/149 |
| 7,173,870 | B2 * | 2/2007 | Lee ............................. 365/222 |
| 7,212,461 | B2 * | 5/2007 | Kim et al. .................... 365/222 |
| 2002/0000581 | A1 | 1/2002 | Yamasaki |
| 2005/0265103 | A1 | 12/2005 | Remaklus, Jr. et al. |

FOREIGN PATENT DOCUMENTS

| JP | 2005-216429 | 8/2005 |
| JP | 2006-004558 | 1/2006 |

\* cited by examiner

*Primary Examiner*—Gene N. Auduong
(74) *Attorney, Agent, or Firm*—Blakely, Sokoloff, Taylor & Zafman LLP

(57) ABSTRACT

The present invention relates to a semiconductor memory device to execute a refresh operation in such a manner that an entry and an exit of a self refresh mode is carried out. The present invention uses only external clock signals without a clock enable signal or an auto refresh command and therefore it is possible to implement a simple circuit for the self refresh. A semiconductor memory device includes a self refresh enable signal generator for outputting an activated self refresh enable signal when positive and negative external clock signals are in phase and a de-activated self refresh enable signal when the positive and negative external clock signals are out of phase and a self refresh block for performing a self refresh operation in response to the activated self refresh enable signal.

14 Claims, 2 Drawing Sheets

SEMICONDUCTOR MEMORY DEVICE PERFORMING SELF REFRESH OPERATION

CROSS-REFERENCE TO RELATED APPLICATIONS

The present application contains subject matter related to the Korean patent application No. KR 10-2006-0038717, filed in the Korean Patent Office on Apr. 28, 2006, the entire contents of which being incorporated herein by references.

BACKGROUND OF THE INVENTION

The present invention relates to a semiconductor memory device; and more particular, to a semiconductor memory device, such as a Dynamic Random Access Memory (DRAM), to execute a refresh operation in such a manner that an entry and an exit of a self refresh mode is carried out.

A DRAM cell is comprised of a switching transistor and a capacitor to store electric charges (data). The identification of the 'High' and 'Low' data is dependent upon a voltage applied to the capacitor, that is, dependent upon the presence or absence of the charges in the capacitor of the cell.

The data storage itself does not cause the power consumption mainly because the charges are stored in the capacitor. However, since a leakage current is caused in a PN junction of a MOS transistor, an initial amount of charges can disappear and this disappearance of the charges makes the data extinguished. To prevent this problem, before the data are extinguished, a recharge operation is performed in which the stored data is read out and the read-out data is restored.

The data maintenance is achieved by the above-mentioned recharge operation and this recharge operation is called a refresh operation. The refresh operation is typically carried out through a DRAM controller. The refresh is classified into two methods. The first method is an external refresh to issue a refresh command from the DRAM controller and the second method is a self refresh in which the DRAM controller issues only a refresh start signal and a refresh operation is continuously carried out itself until a refresh exit signal is issued.

FIG. 1 is a timing diagram illustrating an entry and an exit of a conventional self refresh mode. Referring to FIG. 1, the self refresh mode entry and exist of the conventional synchronization DRAM is recommended by JEDEC (Joint Electron Device Engineering Council) to execute the semiconductor standardization. When a clock enable signal CKE is in a low level and an auto refresh command (AREF: Auto REfresh) is inputted at a rising edge of the first external clock signal CLK after the logically low signal of the clock enable signal CKE (①), the self refresh mode entry starts at the time of activating a self refresh enable signal (SREF_EN(Internal)) (②). In the self refresh, restore operations associated with a specific group of cells are carried out using row address signals generated by a counter provided in the DRAM and other cell groups are restored by changing output signals of the counter for a predetermined period provided by an inner timer. When the external clock signal CLK is changed to a logic high level during this self refresh (③) and a self refresh exit command (SREF: Self REfresh Exit) is inputted at a rising edge of the first external clock signal CLK after the logically high signal of the clock enable signal CKE, the self refresh enable signal (SREF_EN(Internal)) is de-activated so that the self refresh mode is terminated (④).

As illustrated above, the operation of the self refresh mode entry and exit is decided by the external clock signal (CLK) and the auto refresh command (AREF). In the meantime, the self refresh mode entry starts with the proper combination of the clock enable signal (CKE) and the auto refresh command (AREF) which are synchronized with the clock signal (CLK). However, if this combination has a problem such as an error or margin, an erroneous operation can be generated. Furthermore, there are many problems in circuit design, that is, there is a high probability of an error of the activation of the internal clock signal CLK after the clock enable signal CKE goes to a logic high level because the input of the external clock signal CLK is not valid while the self refresh operation is executed even though the self refresh mode is in the exit mode.

SUMMARY OF THE INVENTION

It is, therefore, an object of the present invention to provide a sensing signal generating circuit for sensing a self refresh mode, which is capable of making external clock signals de-activated during a self refresh mode of a semiconductor memory device and sensing the external clock signals at the time of a self refresh mode entry and exit.

In accordance with an aspect of the present invention, there is provided a semiconductor memory device, including a self refresh enable signal generator for outputting an activated self refresh enable signal when positive and negative external clock signals are in phase and a de-activated self refresh enable signal when the positive and negative external clock signals are out of phase; and a self refresh block for performing a self refresh operation in response to the activated self refresh enable signal.

In accordance with another aspect of the present invention, there is provided a semiconductor memory device comprising: a first buffering unit for buffering a positive external clock signal and then outputting a first internal clock signal; a second buffering unit for buffering a negative external clock signal and then outputting a second internal clock signal; a detecting unit for determining whether the first and second internal clock signals are in phase or out of phase and for outputting a self refresh enable signal; and a filtering unit for removing a glitch by filtering the self refresh enable signal.

In accordance with a further aspect of the present invention, there is provided a method for driving a semiconductor memory device including the steps of receiving positive and negative external clock signals, activating or de-activating a self refresh enable signal by determining whether the first and second internal clock signals are in phase or out of phase, entering a self refresh mode when the self refresh enable signal is activated, and exiting from the self refresh mode when the self refresh enable signal is de-activated.

BRIEF DESCRIPTION OF THE DRAWINGS

The above and other objects and features of the present invention will become better understood with respect to the following description of the preferred embodiments given in conjunction with the accompanying drawings, in which.

DESCRIPTION OF SPECIFIC EMBODIMENTS

Embodiments of the present invention will be described with reference to the accompanying drawings. Since these embodiments are provided so that a person of ordinary skill in the art will be able to understand the present invention, they may be modified in various manners and the scope of the present invention is not limited by the embodiments described herein.

Figure 1:
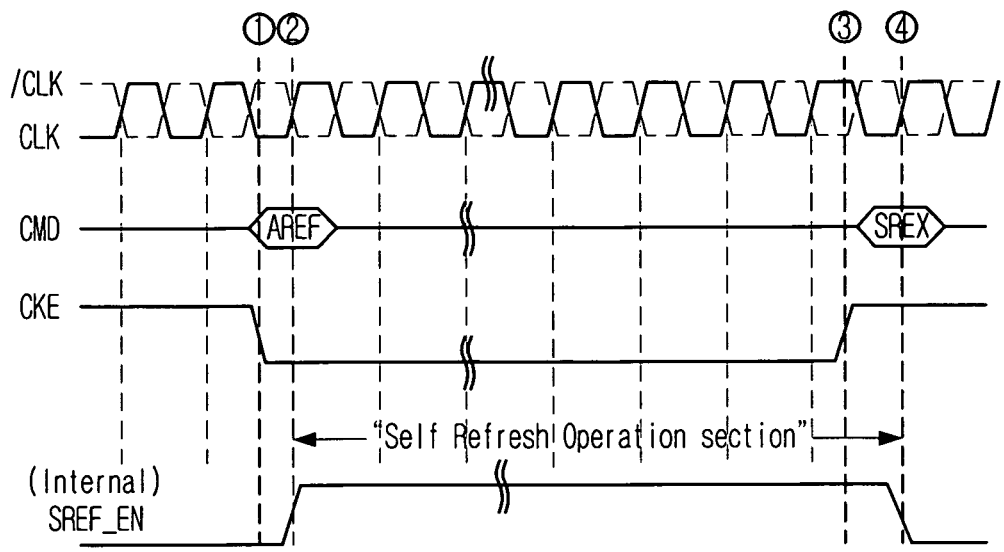
FIG. 1 is a timing diagram illustrating an entry and an exit of a conventional self refresh mode.
Figure 2:
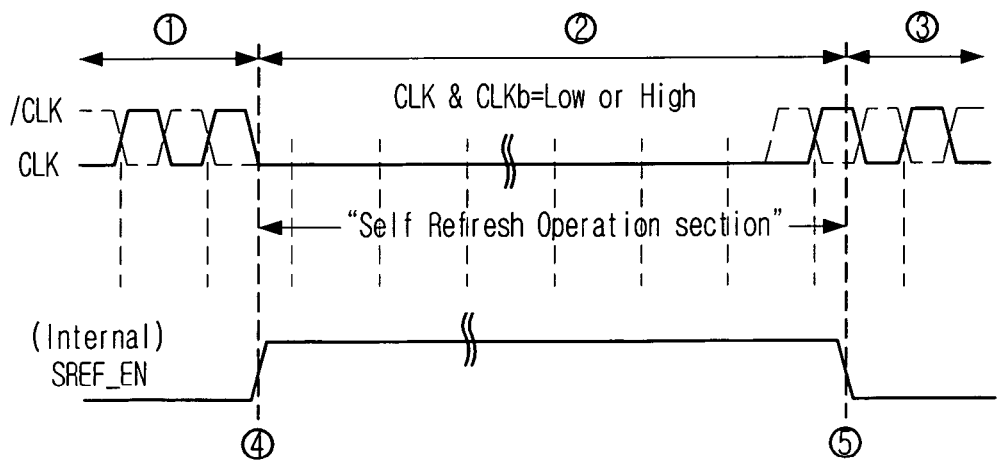
FIG. 2 is a timing diagram illustrating self refresh mode entry and exit according to the present invention.

FIG. 2 is a timing diagram illustrating self refresh mode entry and exit according to the present invention. Referring to FIG. 2, the self refresh mode entry and exit according to one embodiment of the present invention includes the steps of: inputting a positive external clock signal CLK and a negative external clock signal CLKb; activating a self refresh enable signal SREF_EN(Internal) when the positive and negative external clock signals CLK and CLKb are fixed to the same phase (i.e., the voltage of the positive and negative external clock signals CLK and CLKb is in a low or high level) (②); comparing the inputted positive external clock signal CLK with the inputted negative external clock signal CLKb and de-activating the self refresh enable signal SREF_EN(Internal when the positive external clock signal CLK is out of phase with the negative external clock signal CLKb (① and ③); entering into the self refresh mode when the self refresh enable signal SREF_EN(Internal) is activated (④); and exiting from the self refresh mode when the self refresh enable signal SREF_EN(Internal) is de-activated (⑤).

Figure 3A:
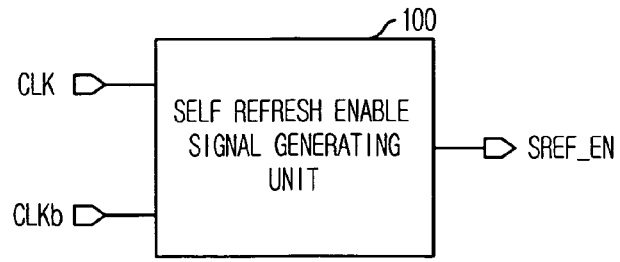
FIG. 3A is a block diagram illustrating a self refresh enable signal generating unit to determine the self refresh mode entry and exit according to one embodiment of the present invention.

FIG. 3A is a block diagram illustrating a self refresh enable signal generating unit to determine the self refresh mode entry and exit according to the present invention.

Referring to FIG. 3A, the self refresh enable signal generating unit 100 outputs an activated self refresh enable signal SREF_EN, when the positive and negative external clock signals CLK and CLKb are in phase, and outputs a de-activated self refresh enable signal SREF_EN when the positive external clock signal CLK is out of phase with the negative external clock signal CLKb.

The self refresh enable signal generating unit 100 receives the positive and negative external clock signals CLK and CLKb and then compares the phase of the positive external clock signal CLK with that of the negative external clock signal CLKb. Based on the result of the comparison, the self refresh enable signal generating unit 100 determines the logic level of the self refresh enable signal SREF_EN.

Figure 3B:
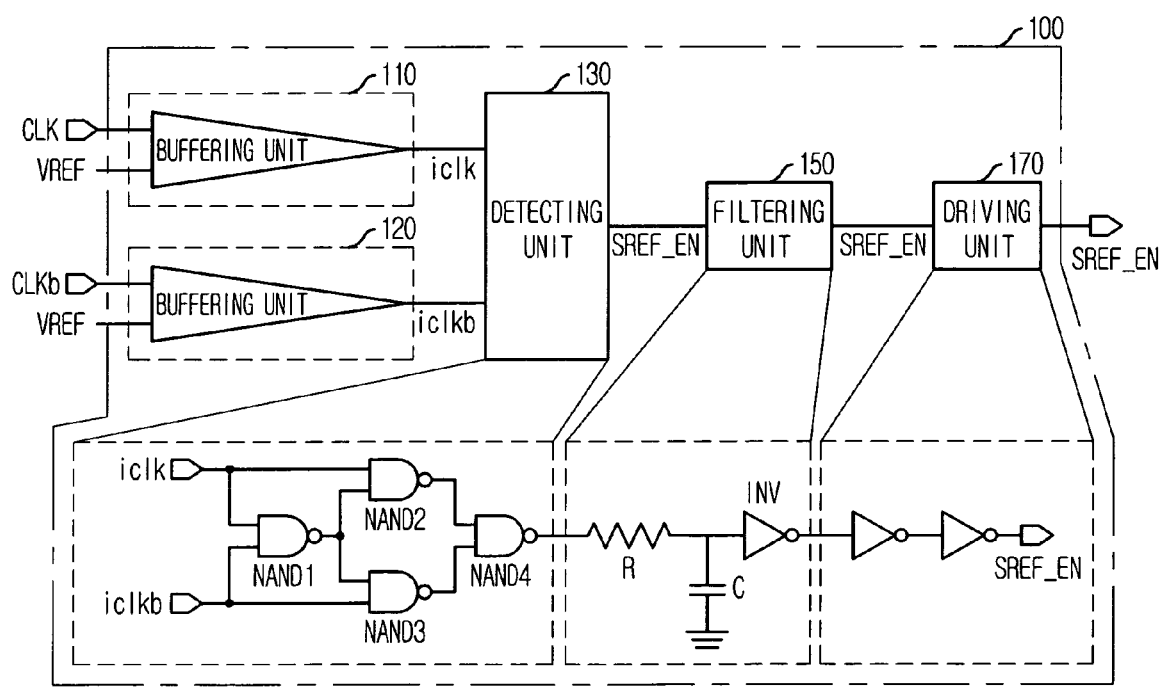
FIG. 3B is a detailed circuit diagram illustrating the self refresh enable signal generating unit of FIG. 3A.

FIG. 3B is a detailed circuit diagram illustrating the self refresh enable signal generating unit 100 to determine the self refresh mode entry and exit according to the present invention.

Referring to FIG. 3B, the self refresh enable signal generating unit 100 includes a first buffering unit 110, a second buffering unit 120, a detecting unit 130 and a filtering unit 150.

The first buffering unit 110 temporarily stores the positive external clock signal CLK and then outputs a first internal clock signal iclk. The second buffering unit 120 temporarily stores the negative external clock signal CLKb and then outputs a second internal clock signal iclkb. The detecting unit 130 determines whether the first and second internal clock signals iclk and iclkb are in phase or out of phase and activates or de-activates the self refresh enable signal SREF_EN. The filtering unit 150 removes the glitch by filtering the self refresh enable signal SREF_EN and outputs it. The self refresh enable signal generating unit 100 further includes a driving unit 170, which has a plurality of inverters, to drive the self refresh enable signal SREF_EN with the maintenance of a constant logic level.

The detecting unit 130 includes: a first NAND gate NAND1 for receiving the first inner clock signal iclk and the second internal clock signal iclkb and for NANDing the received first and second inner clock signals iclk and iclkb; a second NAND gate NAND2 for receiving the first inner clock signal iclk and an output signal from the first NAND gate NAND1 and for NANDing the received first inner clock signal iclk and the output signal from the first NAND gate NAND1; a third NAND gate NAND3 for receiving the second internal clock signal iclkb and the output signal from the first NAND gate NAND1 and for NANDing the received second inner clock signal iclkb and the output signal from the first NAND gate NAND1; and a fourth NAND gate NAND4 for receiving output signals from the second and third NAND gate NAND2 and NAND3 and for NANDing the received signals to output the self refresh enable signal SREF_EN.

In this case, the detecting unit 130 activates the self refresh enable signal SREF_EN when the first and second internal clock signals iclk and iclkb are in phase and de-activates the self refresh enable signal SREF_EN when the first and second internal clock signals iclk and iclkb are out of phase.

Moreover, since the filtering unit 150 includes a filter having a resistor (R) and a capacitor (C), which are in parallel coupled to each other, to remove the glitch and an inverter INV to invert an output signal from the filter.

In this case, filtering unit 150 removes the glitch which is generated at a point of time the phases of the first and second internal clocks iclk and iclkb intersect each other at a toggling or have a different duty cycle or transition time. The glitch can generally cause a malfunction such as an error, abruptly generated pulse or noise.

Figure 3C:
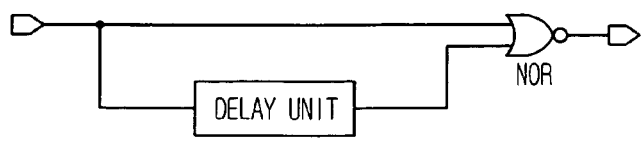
FIG. 3C is a circuit diagram illustrating a filtering unit used in the self refresh enable signal generating unit of FIG. 3B according to another embodiment of the prevent invention.

FIG. 3C is a circuit diagram illustrating a filtering unit used in the self refresh enable signal generating unit of FIG. 3B according to another embodiment of the prevent invention.

Referring to FIGS. 3B and 3C, the filtering unit according to another embodiment of the prevent invention includes a delay unit and a NOR gate NOR. When the first and second external clock signals CLK and CLKb are in phase, the delay unit delays an input signal to determine whether a toggling of the self refresh enable signal SREF_EN is a glitch or not. The NOR gate NOR recognizes the glitch, when the time to maintain the toggling of the self refresh enable signal SREF_EN is smaller than the delay time of the delay unit, and removes the glitch by NORing the input signal and the delayed signal from the delay unit.

Further to the self refresh enable signal generating unit, a method for producing the self refresh enable signal SREF_EN includes the steps of: receiving and buffering the positive external clock signal CLK and outputting the first internal clock signal iclk; receiving and buffering the negative external clock signal CLKb and outputting the second internal clock signal iclkb; activating or de-activating the self refresh enable signal SREF_EN by determining whether the first and second internal clock signals iclk and iclkb are in phase or out of phase; removing irregularly generated glitches from the received self refresh enable signal SREF_EN through a filtering operation; and entering or exiting from the self refresh mode in response to the activation or de-activation of the self refresh enable signal SREF_EN.

Furthermore, the positive and negative external clock signals CLK and CLKb are enabled or disabled by a controller which is provided outside the memory device. The meaning of the "enable" is that the positive and negative external clock signals CLK and CLKb are toggled between a logic "High" state and a logic "Low" state. Also, the meaning of the "disable" is that the positive and negative external clock signals CLK and CLKb are kept in a logic level of "High" or "Low" state without any transition. Typically, since the positive and negative external clock signals CLK and CLKb are disabled in order to reduce current consumption, the meaning of the disable is also that the positive and negative external clock signals CLK and CLKb are kept in a logic "Low" state without any transition.

As mentioned above, only the state of the external clock signals CLK and CLKb is sensed without the combination of the clock enable signal CKE or the auto refresh command (AREF: Auto Refresh). The self refresh operation of the memory device is carried out by controlling the entry or exit of the self refresh mode through the activation or de-activation of the self refresh enable signal SREF_EN. However, the above-mentioned logic gates are implemented by various types of other logic circuits based on the input signals or the configuration thereof.

As apparent from the above, since the present invention uses only external clock signals without the combination of the clock enable signal or the auto refresh command, it is possible to implement a simple circuit for the self refresh. Also, since there is no transition of the external clock signals, the whole memory system, as well as DRAM, itself can reduce the power consumption.

While the present invention has been described with respect to certain preferred embodiments, it will be apparent to those skilled in the art that various changes and modifications may be made without departing from the spirit and scope of the invention as defined in the following claims. For example, the configuration and type of the logic gates and the transistors can be modified and changed.

What is claimed is:

1. A semiconductor memory device, comprising:
    a self refresh enable signal generator for outputting an activated self refresh enable signal when positive and negative external clock signals are in phase and a de-activated self refresh enable signal when the positive and negative external clock signals are out of phase; and
    a self refresh block for performing a self refresh operation in response to the activated self refresh enable signal.

2. The semiconductor memory device in accordance with claim 1, wherein the self refresh enable signal generator compares the positive and negative external clock signals and determines a logic level of the activated or de-activated self refresh enable signal in response to a result of the comparison.

3. A semiconductor memory device, comprising:
    a first buffering unit for buffering a positive external clock signal and then outputting a first internal clock signal;
    a second buffering unit for buffering a negative external clock signal and then outputting a second internal clock signal;
    a detecting unit for determining whether the first and second internal clock signals are in phase or out of phase and for outputting a self refresh enable signal; and
    a filtering unit for removing a glitch by filtering the self refresh enable signal.

4. The semiconductor memory device in accordance with claim 3, further comprising a driving means including a plurality of inverters for driving the self refresh enable signal and for maintaining the driven refresh enable signal at a constant logic level.

5. The semiconductor memory device in accordance with claim 3, wherein the detecting unit activates the self refresh enable signal when the first and second internal clock signals are in phase and wherein the detecting unit de-activates the self refresh enable signal when the first and second internal clock signals are out of phase.

6. The semiconductor memory device in accordance with claim 5, wherein the detecting unit includes:
    a first NAND gate for receiving the first inner clock signal and the second internal clock signal and for NANDing the received first and second inner clock signals;
    a second NAND gate for receiving the first inner clock signal and an output signal from the first NAND gate and for NANDing the received first inner clock signal and the output signal from the first NAND gate;
    a third NAND gate for receiving the second internal clock signal and the output signal from the first NAND gate and for NANDing the received second inner clock signal and the output signal from the first NAND gate; and
    a fourth NAND gate for receiving output signals from the second and third NAND gates and for NANDing the received signals to output the self refresh enable signal.

7. The semiconductor memory device in accordance with claim 3, wherein the filtering unit removes the glitch from the self refresh enable signal when the first and second internal clocks intersect each other at a toggling operation or have a different duty cycle or a transition time.

8. The semiconductor memory device in accordance with claim 7, wherein the filtering unit includes:
    a filter having a resistor and a capacitor, which are in parallel coupled to each other, to remove the glitch from the self refresh enable signal; and
    an inverter for inverting an output signal of the filter.

9. The semiconductor memory device in accordance with claim 7, wherein the filtering unit includes:
    a delay unit for delaying the self refresh enable signal to determine whether a toggling of the self refresh enable signal is a glitch or not; and
    a NOR gate for recognizing the glitch, when a time to maintain the toggling of the self refresh enable signal is smaller than a delay time of the delay unit, and for removing the glitch by NORing the self refresh enable signal and a delayed signal from the delay unit.

10. The memory device in accordance with claim 9, wherein the positive and negative external clock signals are enabled by an external controller.

11. The memory device in accordance with claim 10, wherein the positive and negative external clock signals are disabled by an external controller.

12. A method for driving a semiconductor memory device comprising the steps of:
    receiving positive and negative external clock signals;
    activating or de-activating a self refresh enable signal by determining whether the first and second internal clock signals are in phase or out of phase;
    entering a self refresh mode when the self refresh enable signal is activated; and
    exiting from the self refresh mode when the self refresh enable signal is de-activated.

13. The method as recited in claim 12, further comprising the step of removing an irregularly generated glitch from the self refresh enable signal through a filtering operation.

14. The method as recited in claim 12, wherein the step of activating or de-activating the self refresh enable signal includes the step of comparing a phase of the positive external clock signal with that of the negative external clock signal.

* * * * *